United States Patent [19]
Suzuki et al.

[11] Patent Number: 5,848,868
[45] Date of Patent: Dec. 15, 1998

[54] WAFER CONVEYING APPARATUS

[75] Inventors: Yasunobu Suzuki; Hirofumi Moroe; Kazuhiro Imai, all of Musashi-Murayama; Tetsuya Kobaru, Musashi Murayama, all of Japan

[73] Assignee: Kabushiki Kaisha Shinkawa, Tokyo, Japan

[21] Appl. No.: 837,892

[22] Filed: Apr. 22, 1997

[30] Foreign Application Priority Data

Apr. 22, 1996 [JP] Japan ................................. 8-122838

[51] Int. Cl.⁶ ................................................. B65G 47/24
[52] U.S. Cl. ...................... 414/416; 414/222; 414/217; 414/757; 414/937; 414/936; 356/399
[58] Field of Search .................... 414/416, 217, 414/757, 939, 937, 838, 936, 935, 418, 222, 225, 226; 118/719; 356/399; 198/339.1

[56] References Cited

U.S. PATENT DOCUMENTS

| | | | |
|---|---|---|---|
| 3,902,615 | 9/1975 | Levy et al. | 414/936 X |
| 4,178,113 | 12/1979 | Beaver, II et al. | 414/937 |
| 4,507,078 | 3/1985 | Tam et al. | 414/936 X |
| 4,764,076 | 8/1988 | Layman et al. | 414/217 |
| 4,824,309 | 4/1989 | Kakehi et al. | 414/217 |
| 4,900,212 | 2/1990 | Mikahara | 414/937 X |
| 4,938,654 | 7/1990 | Schram | 414/757 |

FOREIGN PATENT DOCUMENTS

| | | | |
|---|---|---|---|
| 3338994 | 5/1984 | Germany | 414/937 |
| 54-2662 | 1/1979 | Japan . | |
| 55-34451 | 3/1980 | Japan . | |
| 59-110117 | 6/1984 | Japan . | |
| 62-21822 | 7/1987 | Japan . | |
| 63-182833 | 7/1988 | Japan | 414/936 |
| 2-189949 | 7/1990 | Japan . | |
| 2-292196 | 12/1990 | Japan | 414/937 |
| 4-41519 | 7/1992 | Japan . | |

*Primary Examiner*—Frank E. Werner
*Attorney, Agent, or Firm*—Koda & Androlia

[57] ABSTRACT

An apparatus for conveying a wafer to wafer work suction-holding stage and then discharging a worked wafer from the wafer work suction-holding stage, including a loader side elevator device, a wafer position correcting stage, a wafer work suction-holding stage, a wafer carrying table and an unloader side elevator device which are successively disposed in this order; and the apparatus further including a conveyor which conveys a wafer inside a loader side magazine carried on the loader side elevator device to a point above the positional correction suction-holding stage, a stopper which positions the wafer conveyed by the conveyor to the wafer position correcting stage, and a feeding pawl moving device which operates after the wafer position correcting stage and wafer work suction-holding stage have been moved vertically so that the upper surface of the wafer position correcting stage is at substantially the same height as the upper surface of the stopper and so that the upper surface of the wafer work suction-holding stage is at the same height as the upper surfaces of the stopper and wafer carrying table.

3 Claims, 7 Drawing Sheets

WAFER CONVEYING APPARATUS

BACKGROUND OF THE INVENTION

1. Field of the Invention

The present invention relates to a wafer conveying apparatus in which wafers are supplied to a wafer work suction-holding stage from a loader side magazine, and worked wafers are moved into an unloader side magazine.

2. Prior Art

Wafer conveying apparatuses which convey wafers to a wafer work suction-holding stage (on which wafers are held by suction and necessary work is performed on the top surfaces of the wafers) include a system that uses belt conveyors as described in, for instance, Japanese Patent Application Laid-Open (Kokai) Nos. 59-110117 and 2-189949. In another system, wafers are conveyed to the vicinity of the wafer work suction-holding stage by a belt conveying device and then held from both the top and bottom sides by a chucking means so as to be conveyed onto the wafer work suction-holding stage. This prior art is described in, for instance, Japanese Patent Application Laid-Open (Kokai) No. 55-34451.

In the system that conveys wafers to a wafer work suction-holding stage by a belt conveyor, the wafer work suction-holding stage is disposed between a pair of conveyor belts. In other words, the wafers are carried by a pair of conveyor belts, and the wafer work suction-holding stage is disposed between these conveyor belts. Accordingly, the outer diameter of the wafer work suction-holding stage is necessarily reduced so as to fit between the conveyor belts, resulting in that only the central portion of each wafer can be held in place by suction. In cases where wafers are to be coated with a resist, as described in the above-listed Japanese Patent Application Laid-Open Nos. 59-110117 and 2-189949, almost no external force is exerted on the wafers; accordingly, there are no problems even if the wafer work suction-holding stage is small.

However, in cases where, for example, bumps are to be formed on wafers by a bonding apparatus, or in cases where grooves are to be cut in the top surfaces of wafers in a checkerboard pattern by a rotary grindstone blade as shown in the above-identified Japanese Patent Application Laid-Open No. 55-34451, an external force inevitably is applied to the wafers. When working is thus performed with an external force exerted on the wafers, it is necessary that the entire surface of each wafer be held in place by suction on the wafer work suction-holding stage. Therefore, a conveying system which uses a belt conveyor is not suitable.

In the case of the system that uses a belt conveying device and a chucking means in combination, the wafer work suction-holding stage can be made larger than the size of the wafers. Accordingly, this system can be used if work is performed with an external force applied to the wafers. The wafers treated in such cases have a thickness of approximately 0.1 to 1.0 mm and an outer diameter of 75 to 200 mm. Accordingly, if a wafer is held by a chucking means from its both sides, the wafer may be tilted in the front-back direction when the holding force is weak, resulting in that a stable wafer supply action is not achieved. Furthermore, if a strong wafer holding force is applied in order to hold the wafers stably, warping may occur in the wafer, which is undesirable.

SUMMARY OF THE INVENTION

Accordingly, the object of the present invention is to provide a wafer conveying apparatus which can supply wafers to a wafer work suction-holding stage and discharge the wafers therefrom in a stable manner without applying any excessive external force to the wafers.

The object of the present invention is accomplished by a unique structure for a wafer conveying apparatus in which wafers are supplied to a wafer work suction-holding stage from a loader side magazine, and worked wafers are moved into an unloader side magazine, and the unique structure of the wafer conveying apparatus of the present invention comprises:

- a positional correction suction-holding stage for correcting the positions of the wafers, the positional correction suction-holding stage being disposed between a loader side magazine and the wafer work suction-holding stage and movable up and down and further rotatable;
- a wafer carrying table with a flat upper surface, the wafer carrying table being disposed between the wafer work suction-holding stage and the unloader side magazine and having a space at the center thereof with regard to a wafer conveying direction;
- loader side and unloader side elevators which respectively raise and lower the loader side magazine and unloader side magazine;
- a conveyor which conveys wafers from the inside of the loader side magazine to a point above the positional correction suction-holding stage;
- a pair of wafer position correcting pawls disposed so as to face each other in a direction perpendicular to the wafer conveying direction, the pawls positioning the wafers by moving back and forth while the wafers are being raised slightly from the conveyor by the positional correction suction-holding stage;
- a stopper disposed between the positional correction suction-holding stage and the wafer work suction-holding stage so as to position the wafers; and
- a feeding pawl moving device for pushing the rear end of each wafer, the feeding pawl moving device being actuated:
  - after the positional correction suction-holding stage has been raised or lowered so that the upper surface of the positional correction suction-holding stage is positioned at substantially the same level as the upper surface of the stopper, or
  - after the wafer work suction-holding stage has been raised or lowered so that the upper surface of the wafer work suction-holding stage is positioned at substantially the same level as the upper surfaces of the stopper and wafer carrying table.

The object of the present invention is accomplished by another unique structure which is employed in the structure described above, wherein the feeding pawl moving device includes first, second and third feeding pawl arms which are driven in the vertical direction and in the wafer conveying direction, and the feeding pawl of the first feeding pawl arm pushes the rear end of the wafer on the positional correction suction-holding stage so that the wafer is moved over the stopper and onto the wafer work suction-holding stage, the feeding pawl of the second feeding pawl arm pushes the rear end of the wafer on the wafer suction-holding stage so that the wafer is moved onto the wafer carrying table, and the feeding pawl of the third feeding pawl arm is disposed in the space formed in the wafer carrying table and pushes the rear end of the wafer on the wafer carrying table so that wafer is moved into the unloader side magazine.

DETAILED DESCRIPTION OF THE INVENTION

Figure 2:
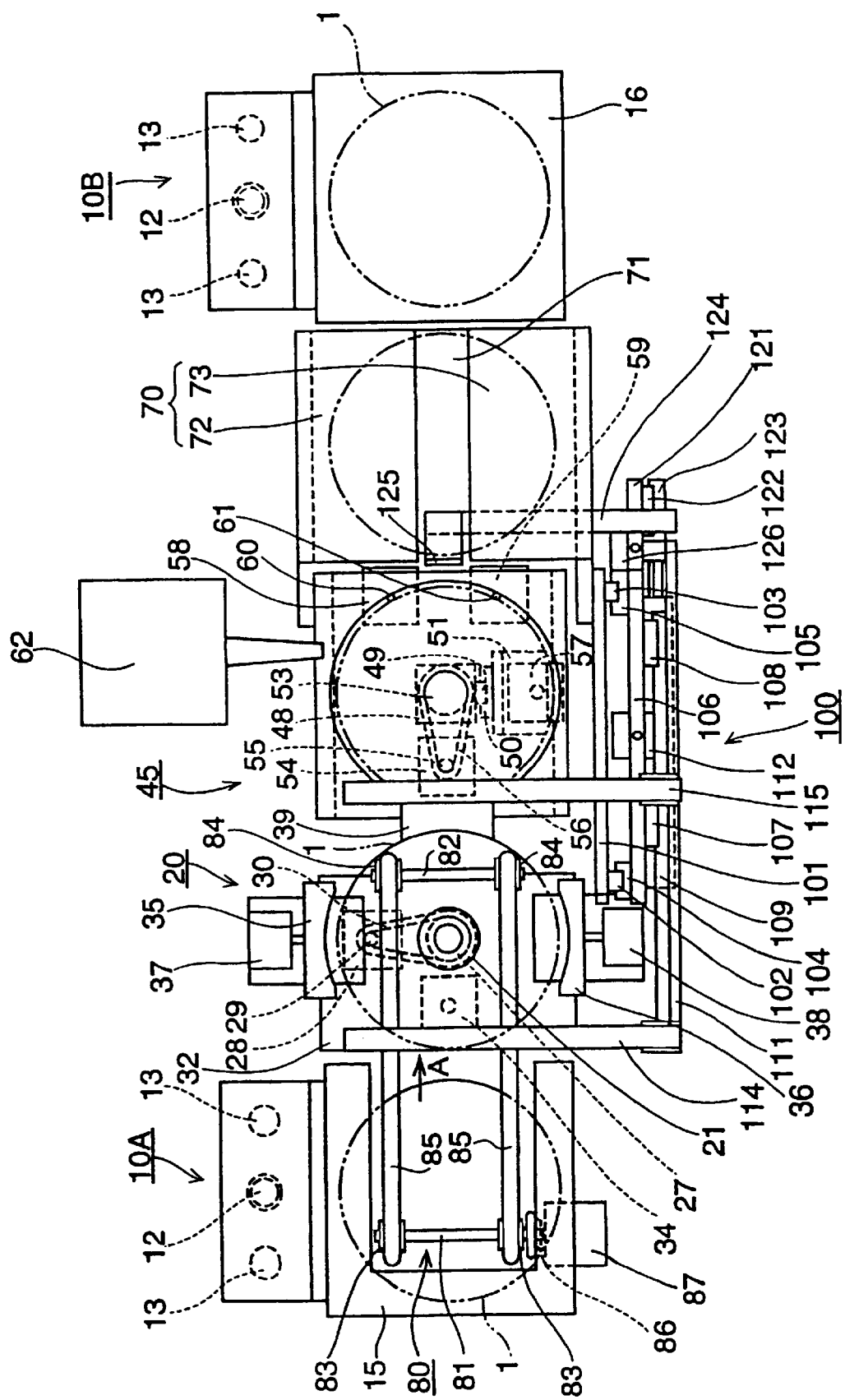
FIG. 2 is a top view of one embodiment of the present invention.

As shown in FIG. 2, a wafer position correcting device 20, a wafer working device 45 and a wafer carrying table 70 are disposed between a loader side elevator device 10A and an unloader side elevator device 10B in the order described above from the loader side elevator device 10A.

Figure 3:
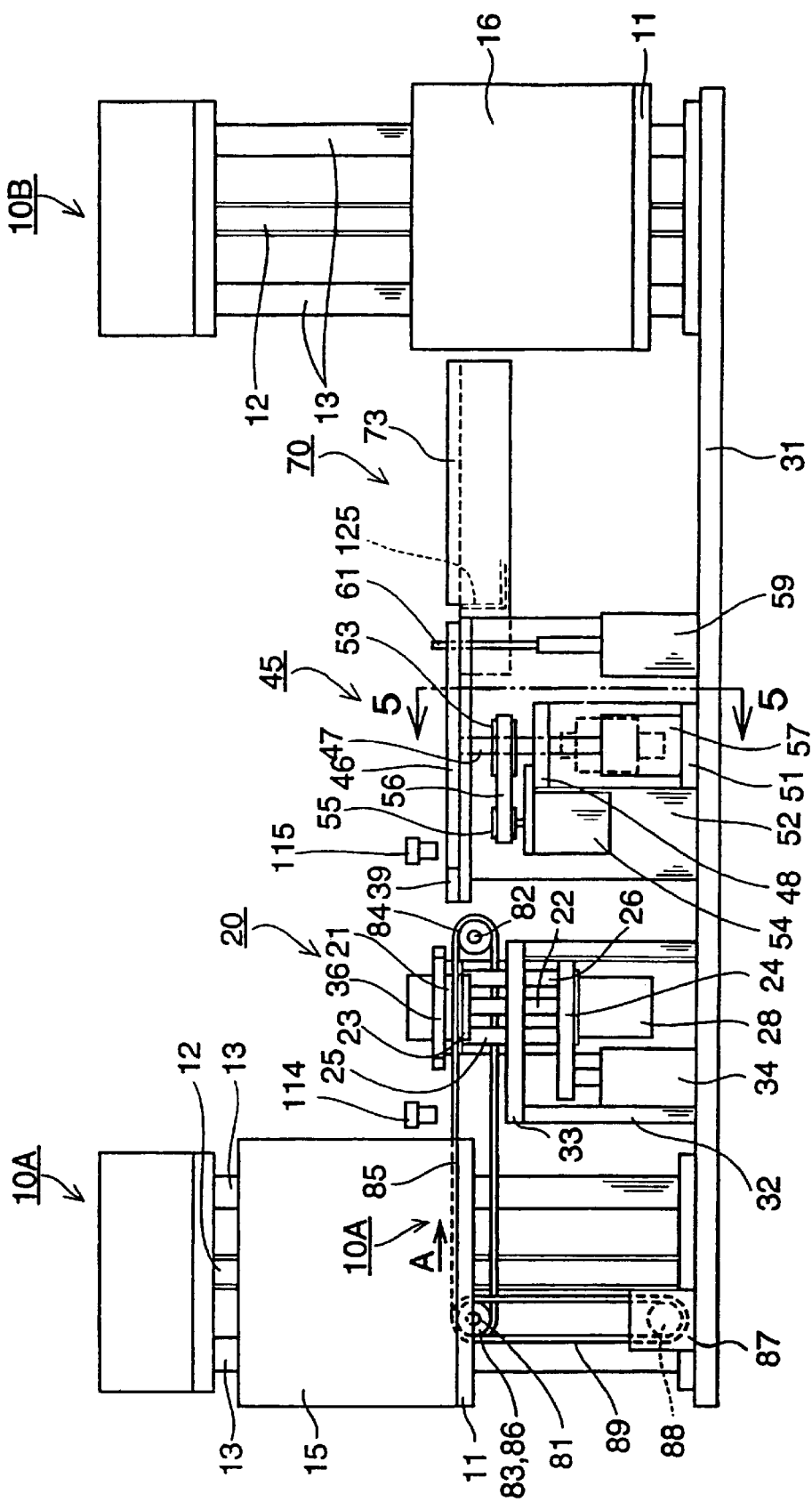
FIG. 3 is a front view of the feeding pawl moving device shown in FIG. 2 with the details thereof omitted;.
Figure 4:
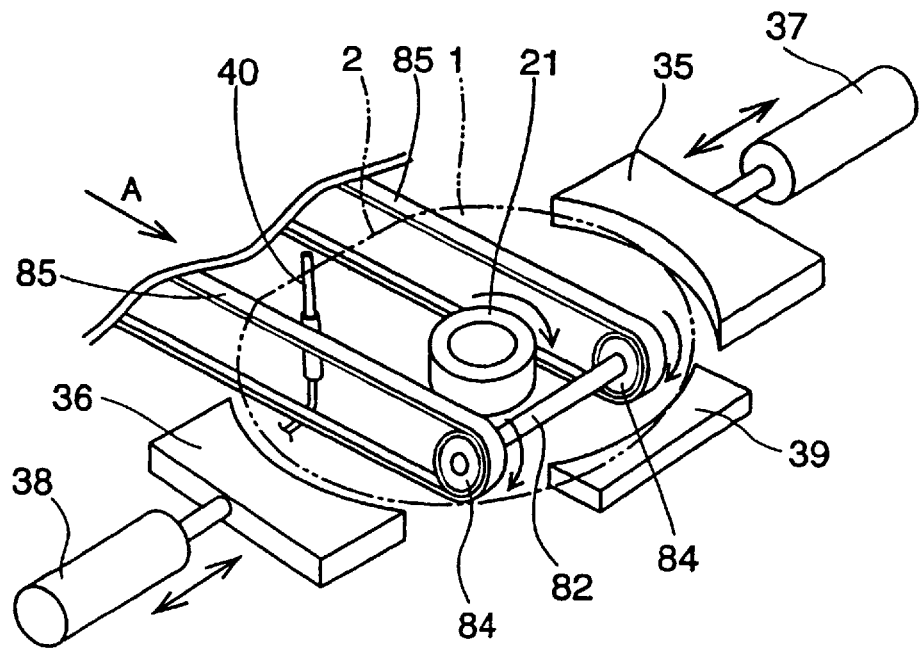
FIG. 4 is an enlarged perspective view of the wafer position correcting device.
Figure 5:
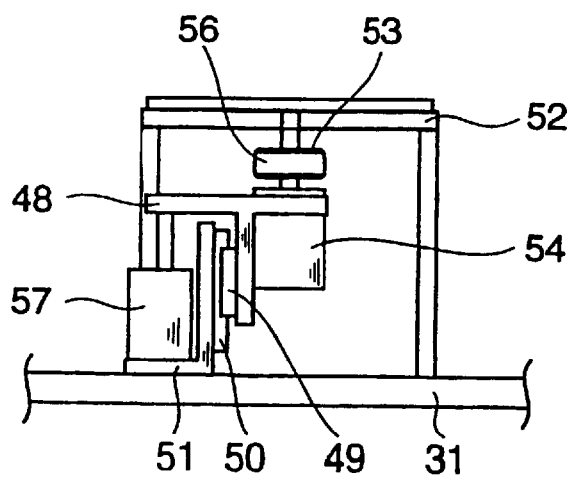
FIG. 5 is a view seen in the direction indicated by the arrows from line 5—5 in FIG. 3.

The loader side elevator device 10A and the unloader side elevator device 10B have the same structure which is known in prior art; accordingly, these devices will be described only briefly. As shown in FIGS. 2 and 3, an elevator stage 11 includes an internal threaded element (not shown) which is screw-engaged with a screw shaft 12 that is rotated by a motor (not shown), so that the elevator stage 11 is driven upward and downward along guide rods 13.

Loader side and unloader side magazines 15 and 16 are respectively positioned and carried on the elevator stages 11 of the loader side and unloader side elevator devices 10A and 10B and have a known structure. In other words, a plurality of wafers 1 are accommodated at a constant vertical spacing inside the loader side and unloader side magazines 15 and 16. The loader side magazine 15 is open toward the wafer position correcting device 20 and at the bottom thereof, and the unloader side magazine 16 is open toward the wafer carrying table 70 and at the bottom thereof The loader side and unloader side magazines 15 and 16 can indeed be the same.

Next, the structure of the wafer position correcting device 20 will be described with reference to FIGS. 1 through 4.

The upper and lower ends of the stage shaft 22 of a positional correction suction-holding stage 21 which holds a wafer 1 in place by vacuum suction are rotatably supported by raising-and-lowering supporting plates 23 and 24. The raising-and-lowering supporting plates 23 and 24 are formed integrally by guide shafts 25 and 26. A driven pulley 27 is fastened to the stage shaft 22, and a θ correction motor 28 is fastened to the raising-and-lowering supporting plate 23. A belt 30 is mounted on the driven pulley 27 and a drive pulley 29 which is coupled to the output shaft of the θ correction motor 28. A supporting frame 32 is attached to a base plate 31, and guide shafts 25 and 26 are passed through the top plate 33 of the supporting frame 32 so that the guide shafts 25 and 26 can slide upward and downward. Furthermore, a first stage mover cylinder 34 is provided on the base plate 31, and the operating rod of this first stage mover cylinder 34 is connected to the raising-and-lowering supporting plate 24.

Two wafer position correcting pawls 35 and 36 are disposed so as to face each other in the direction perpendicular to the wafer conveying direction A, so that the pawls 35 and 36 are positioned at the outer circumference of the wafer 1. The wafer position correcting pawls 35 and 36 are operated by respective pawl opening-and-closing cylinders 37 and 38 so as to move back and forth as shown by arrows in FIG. 4. A stopper 39 which positions the wafer 1 is (along with other elements) positioned next to the positional correction suction-holding stage 21 and on the wafer working device 45 side. The stopper 39 is fastened to the upper surface of the support frame 52 of the wafer working device 45 (which will be described later). The upper surface of the stopper 39 is at the same height level as, or slightly lower than, the upper surface of the wafer suction-holding stage 46 of the wafer working device 45 when the wafer suction-holding stage 46 is at a lowered position. Furthermore, the upper surface of the stopper 39 is at the same height level as the upper surfaces of the wafer carrying plates 72 and 73 of the wafer carrying table 70 (which will be described later).

Furthermore, a fiber sensor 40 used for (or horizontal orientation) position correction of a wafer is disposed next to the positional correction suction-holding stage 21 and on the direction of the loader side elevator device 10A side, with the sensor 40 facing upward from below. This θ correction fiber sensor 40 is disposed upright in the region through which the orientation flat 2 of the wafer 1 passes when the positional correction suction-holding stage 21 is rotated after the positioning of the wafer 1 in the X and Y directions has been completed and is held by suction on the positional correction suction-holding stage 21.

Next, the structure of the wafer working device 45 will be described with reference to FIGS. 1 through 3 and FIG. 5.

The wafer suction-holding stage 46 is formed larger than the wafer 1. A stage shaft 47 of the wafer suction-holding stage 46 is rotatably supported by a raising-and-lowering plate 48. A vertical slider 49 which is disposed in an upright position is provided on the raising-and-lowering plate 48 and is slidably engaged with a vertical rail 50. The vertical rail 50 is fastened to a rail-supporting rod 51, and this rail-supporting rod 51 is fastened to the base plate 31. Furthermore, a support frame 52 is fastened to the base plate 31. A driven pulley 53 is fastened to the stage shaft 47, and a stage rotation motor 54 is fastened to the raising-and-lowering plate 48. A belt 56 is mounted on the driven pulley 53 and a drive pulley 55 which is coupled to the output shaft of the stage rotation motor 54. The raising-and-lowering plate 48 is raised and lowered by a second stage mover cylinder 57 which is installed on the base plate 31.

Two stopper pin driving cylinders 58 and 59 are provided on the base plate 31 so as to be on the wafer carrying table 70 side, and stopper pins 60 and 61 are attached to the operating rods of these stopper pin driving cylinders 58 and 59. The stopper pins 60 and 61 pass through holes formed in the support frame 52 and the wafer suction-holding stage 46 and project upward. A bonding apparatus 62 which is known in prior art and performs bonding on the wafer 1 is, as seen in FIG. 2, disposed on one side of the wafer suction-holding stage 46.

Furthermore, the wafer carrying table 70 includes two wafer carrying plates 72 and 73 which are disposed so as to have a space 71 of a predetermined width in the central portion of the wafer carrying table 70. These wafer carrying plates 72 and 73 are fastened to the side surface of the support frame 52 of the wafer working working device 45.

Next, the structure of the wafer conveying apparatus which conveys the wafer 1 will be described.

The wafer conveying apparatus, as best seen in FIG. 2, includes a belt conveyor device 80 and a feeding pawl moving device 100. The belt conveyor device 80 conveys each wafer 1 from the loader side magazine 15 to the wafer position correcting device 20; and the feeding pawl moving device 100 moves each wafer 1 from the positional correction suction-holding stage 21 of the wafer position correcting device 20 to the wafer work suction-holding stage 46 of the wafer working device 45, and from the wafer work suction-holding stage 46 to the wafer carrying table 70, and then from the wafer carrying table 70 to the unloader side elevator device 10B.

Figure 1:
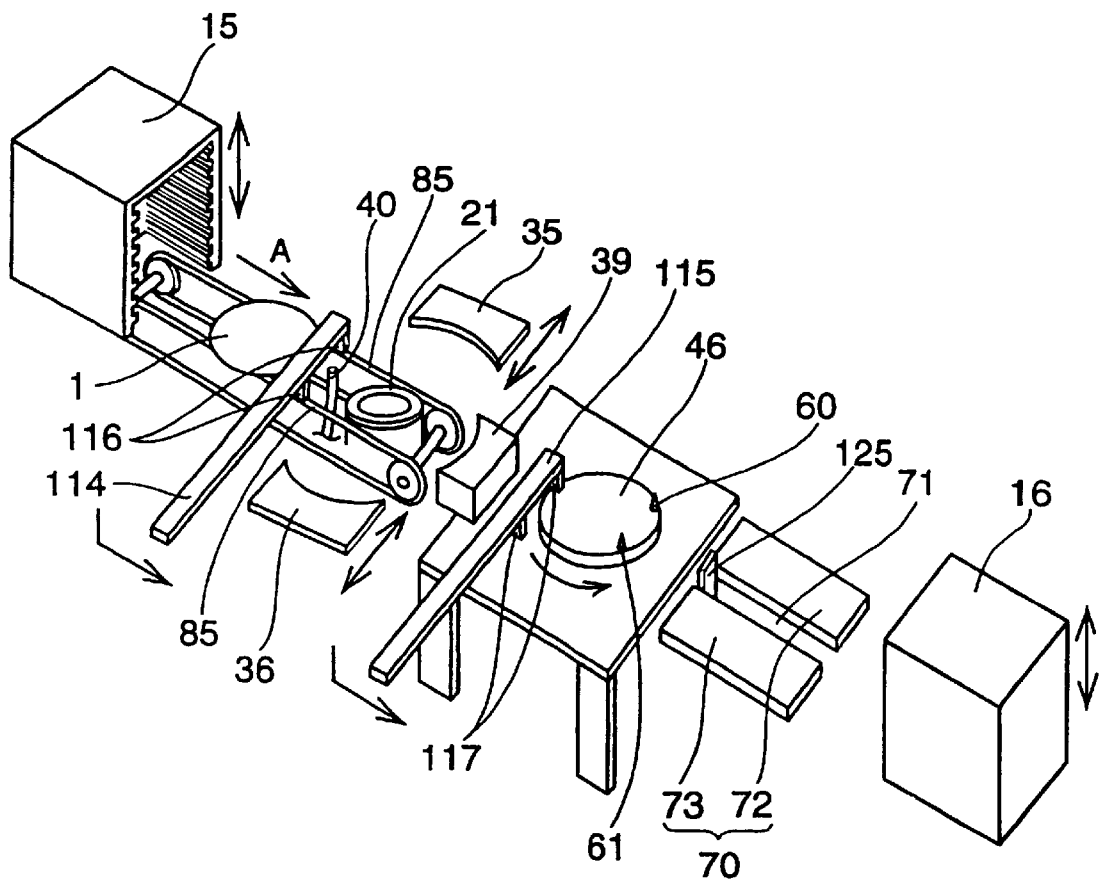
FIG. 1 is a schematic perspective view of the construction of one embodiment of the present invention.

The structure of the belt conveyor device 80 will be described first with reference to FIGS. 1 through 3.

A first driven pulley shaft 81 is disposed inside the lower open portion of the loader side magazine 15 and extends in a direction perpendicular to the wafer conveying direction A, and a second driven pulley shaft 82 is disposed between the positional correction suction-holding stage 21 and the stopper 39 so as to be parallel to the first driven pulley shaft. Two first driven pulleys 83 and two second driven pulley 84 are respectively provided on the first and second driven pulley shafts 81 and 82, and belts 85 are mounted on the first driven pulleys 83 and second driven pulleys 84. Furthermore, a driven pulley 86 is coupled to one end of the first driven pulley shaft 81, a belt driving motor 87 is provided on the base plate 31 beneath the driven pulley 86, and a belt 89 is mounted on the driven pulley 86 and a drive pulley 88 which is coupled on the output shaft of the belt driving motor 87.

Next, the structure of the feeding pawl moving device 100 will be described with reference to FIG. 2 and FIGS. 6 through 8.

Figure 6:
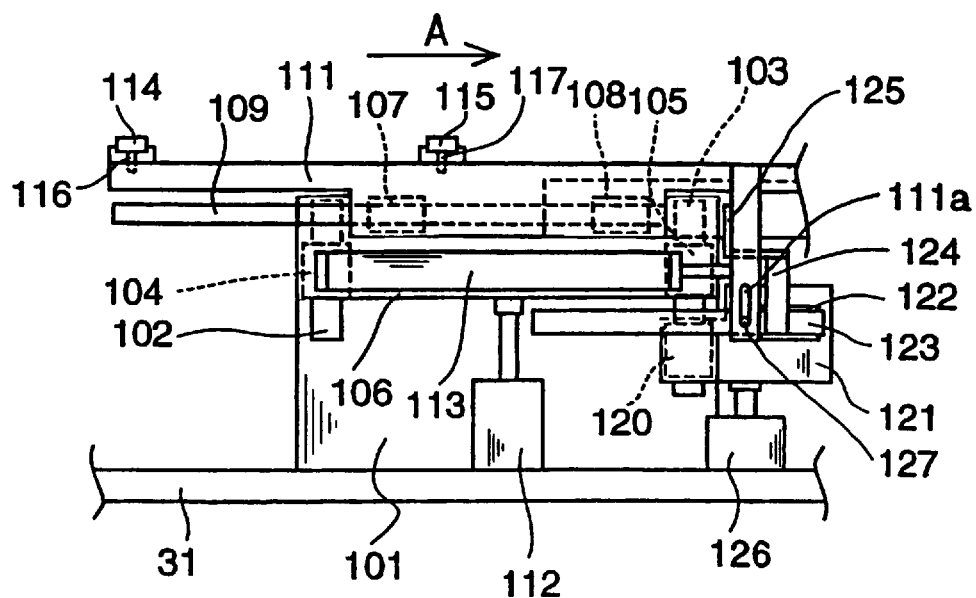
FIG. 6 is a front view of the feeding pawl moving device shown in FIG. 2.

A supporting plate 101 is fastened uprightly to the base plate 31 beside the supporting frame 32 of the wafer position correcting device 20 and also beside the support frame 52 of the wafer working device 45 (see FIGS. 2 and 6). Two raising-and-lowering guide rails 102 and 103 which are disposed in upright positions are fastened to the supporting plate 101. Raising-and-lowering sliders 104 and 105 are slidably engaged with the raising-and-lowering guide rails 102 and 103, and these raising-and-lowering sliders 104 and 105 are also fastened to a raising-and-lowering plate 106. Two horizontal sliders 107 and 108 which are disposed in series in the horizontal direction are fastened to the raising-and-lowering plate 106, and a horizontal guide rail 109 is slidably engaged with the horizontal sliders 107 and 108a. This horizontal guide rail 109 is fastened to a feeding pawl arm holding plate 111. The raising-and-lowering plate 106 is raised and lowered by a feeding pawl cylinder 112 which is provided on the base plate 31, and the feeding pawl arm holding plate 111 is caused to move horizontally by a feeding pawl conveyor cylinder 113 which is fastened to the raising-and-lowering plate 106.

Figure 8:
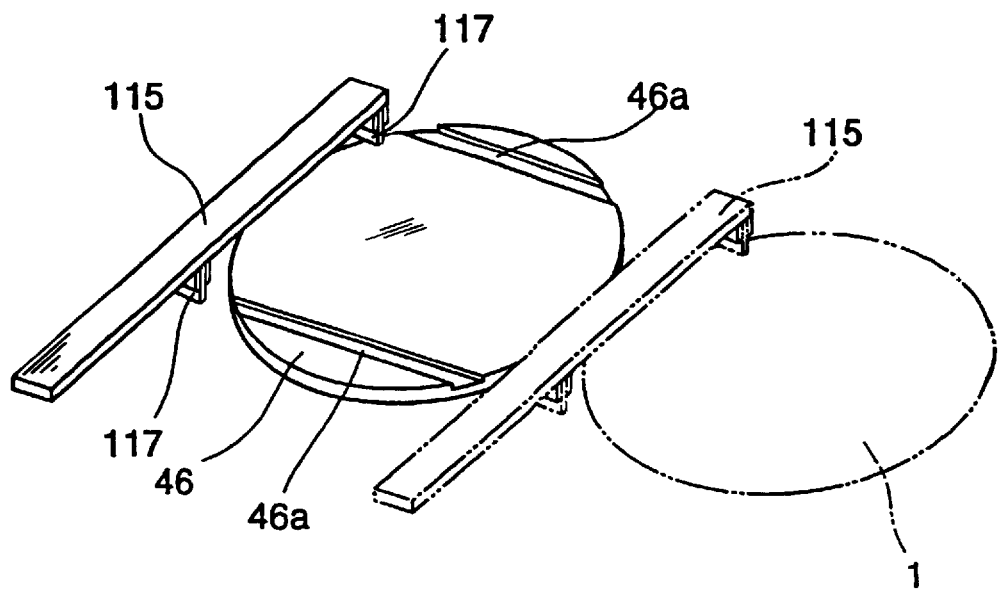
FIG. 8 is a perspective view showing the relationship between the upper surface of the wafer suction-holding stage and the second feeding pawl arm.

The feed pawl arm holding plate 111 is fixedly provided with a first feeding pawl arm 114 and a second feeding pawl arm 115. The first feeding pawl arm 114 extends in a direction perpendicular to the wafer feeding direction indicated by arrow A and is disposed above the wafer conveying plane and between the positional correction suction-holding stage 21 and the loader side elevator device 10A, and likewise the second feeding pawl arm 115 is disposed above the wafer conveying plane and between the positional correction suction-holding stage 21 and the wafer work suction-holding stage 46. Two pairs of feeding pawls 116 and 117 which consist of elastic members such as silicone rubber members are respectively provided on the undersurface of each of the first and second feeding pawl arms 114 and 115. The thickness of each wafer 1 is approximately 0.1 to 1.0 mm. Accordingly, as shown in FIG. 8, grooves 46a are formed in the upper surface of the wafer work suction-holding stage 46 so that the feeding pawls 117 of the second feeding pawl arm 115 do not interfere with the wafer work suction-holding stage 46 when a wafer 1 on the wafer work suction-holding stage 46 is moved onto the wafer carrying plates 72 and 73 of the wafer carrying table 70 by the feeding pawls 117.

Figure 7:
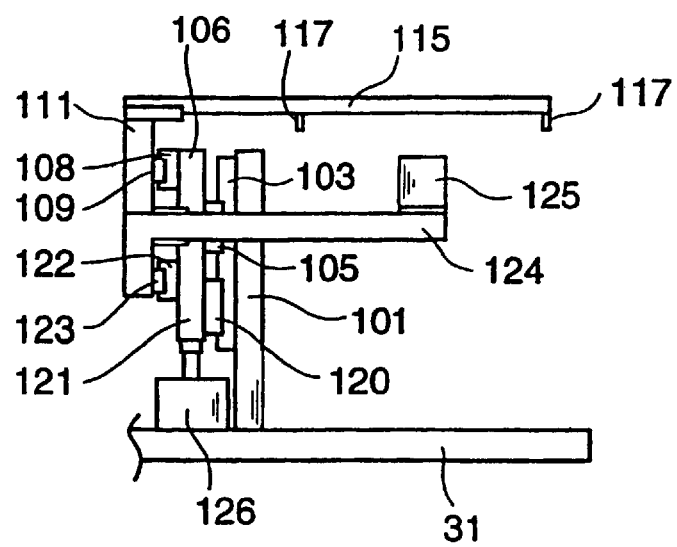
FIG. 7 is a right-side view of FIG. 6.

As best seen in FIG. 7, a raising-and-lowering slider 120 is slidably engaged with the lower portion of the vertically provided guide rail 103. This raising-and-lowering slider 120 is fastened to a raising-and-lowering plate 121, and a horizontal slider 122 which is disposed in the horizontal direction is also fastened to the raising-and-lowering plate 121. A horizontal guide rail 123 is slidably engaged with this horizontal slider 122 and is also fastened to a third feeding pawl arm 124 which extends into the space 71 from beneath the wafer carrying plates 72 and 73 of the wafer carrying table 70. A feeding pawl 125 is fastened to the third feeding pawl arm 124, and the top portion of the feeding pawl 125 projects out of the space 71. The top surface of the feeding pawl 125 is positioned below the upper surfaces of the wafer carrying plates 72 and 73 when the feeding pawl 125 is lowered.

The raising-and-lowering plate 121 is moved up and down by a feeding pawl cylinder 126 which is vertically provided on the base plate 3 1. Furthermore, a vertical slot 111a is formed in the feeding pawl arm holding plate 111, and a pin 127 which is fastened to the horizontal guide rail 123 is inserted into this vertical slot 111a, so that the third feeding pawl arm 124 not only can move horizontally together with the first and second feeding pawl arms 114 and 115 but also can move up and down independently from the first and second feeding pawl arms 114 and 115.

Figure 9:
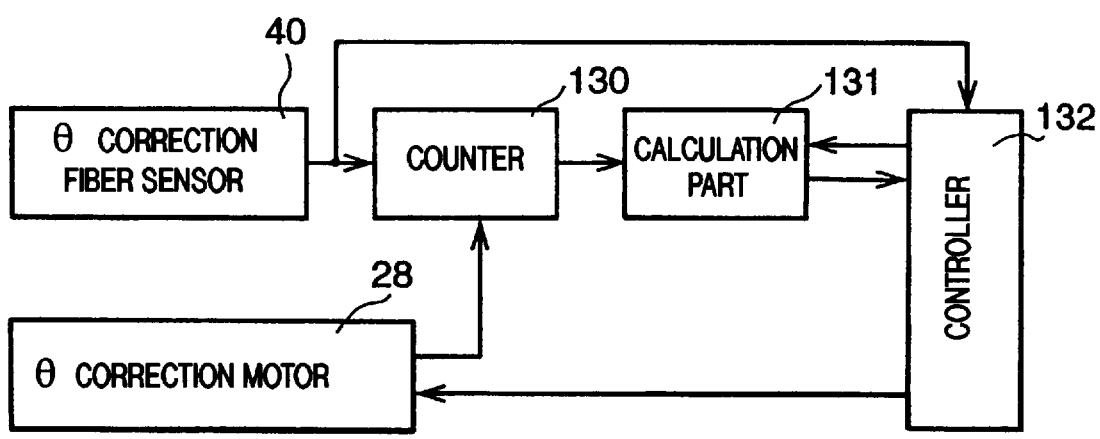
FIG. 9 is a block diagram of the θ correction control device of the wafer position correcting device.

FIG. 9 shows a block diagram of a θ correction control device for the wafer position correcting device 20.

The θ correction control device includes a counter 130 and a calculation part 131. The counter 130 uses as a reference the number of pulses of the θ correction motor 28, which is being rotated in the forward direction (clockwise direction), at the time that orientation flat 2 of the wafer 1, which is being turned, becomes undetectable by the θ correction fiber sensor 40, and the counter 130 counts the number of pulses of the rotating θ correction motor 28 (see FIGS. 2 and 3) at the time that the orientation flat 2 of the wafer 1 shifts to a position that is detectable by the θ correction fiber sensor 40 (see FIG. 1). The operating part 131 calculates and obtains half of the count of this counter 130. The calculation part 131 and the forward rotation of the θ correction motor 28 are controlled by a controller 132.

Next, the operation of the above described embodiment will be described.

Initially, the first and second feeding pawl arms 114 and 115 are in raised positions, and the third feeding pawl arm 124 is in a lowered position. In addition, the bottommost wafer 1 accommodated in the loader side magazine 15 is on the belts 85. In this state, the wafer 1 is conveyed from the loader side magazine 15 to the positional correction suction-holding stage 21 of the wafer position correcting device 20 by the belt conveyor device 80.

In other words, when the belt driving motor 87 rotates, the first driven pulley shaft 81 is rotated via the driving pulley 88, belt 89 and driven pulley 86. As a result, the belts 85 are rotated in the wafer conveying direction A, and the wafer 1 on the belts 85 and inside the loader side magazine 15 is conveyed by the belts 85 until the wafer 1 contacts the stopper 39, and then the belt driving motor 87 stops.

When the belt driving motor 87 stops, the elevator stage 11 of the loader side elevator device 10A is lowered by one pitch, so that next wafer 1 in the lower portion of the loader side magazine 15 is placed on the belts 85 of the belt conveyor device 80.

Next, correction of any deviation of the center of the wafer 1 is performed in the wafer position correcting device 20. More specifically, as seen from FIG. 4, the pawl opening-and-closing cylinders 37 and 38 are operated so that the wafer position correcting pawls 35 and 36 advance, thus correcting any deviation in the position of the center of the wafer 1. In other words, the positioning of the wafer 1 is made in the wafer conveying direction (i. e., in the direction shown by arrow A) by the stopper 39, the operating rod of the first stage mover cylinder 34 is protruded, and the positional correction suction-holding stage 21 is moved upward together with the raising-and-lower supporting plates 23 and 24 and the guide shafts 25 and 26, thus causing the upper surface of the positional correction suction-holding stage 21 to be positioned at substantially the same height level as the upper surface of the stopper 39. As a result, the wafer 1 on the positional correction suction-holding stage 21 is lifted from the belts 85, and a positioning in the direction perpendicular to the wafer conveying direction (i. e., the direction indicated by arrow A) is made by the wafer position correcting pawls 35 and 36. Then, the vacuum suction of the positional correction suction-holding stage 21 is operated, so that the positional correction suction-holding stage 21 holds the wafer 1 by vacuum suction. Next, the pawl opening-and-closing cylinders 37 and 38 are operated in the reverse direction from the direction described above, so that the wafer position correcting pawls 35 and 36 are withdrawn from the wafer 1.

Next, θ correction of the wafer 1 is performed. The θ correction will be described primarily with reference to FIGS. 10(a) through 10(d).

Figure 10A:
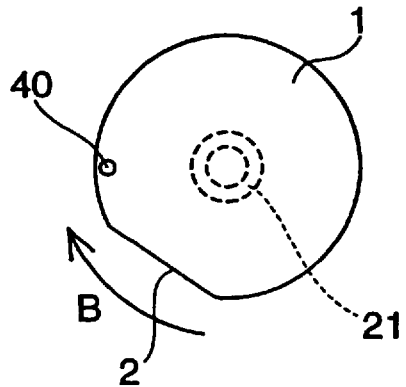
FIGS. 10(a) through 10(d) are an explanatory diagrams which illustrate the θ correction method.
Figure 10B:
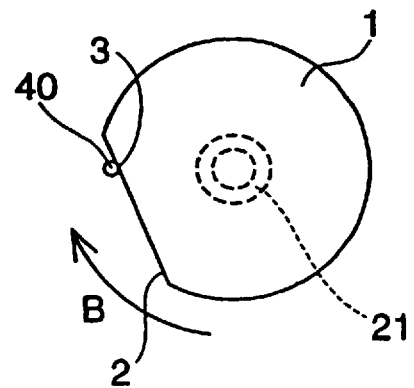
Figure 10C:
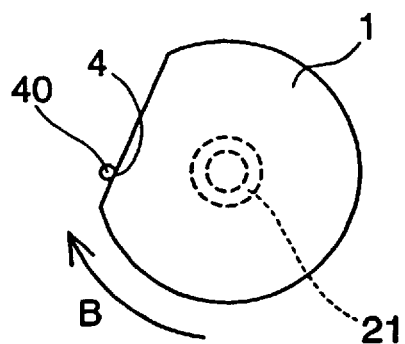
Figure 10D:
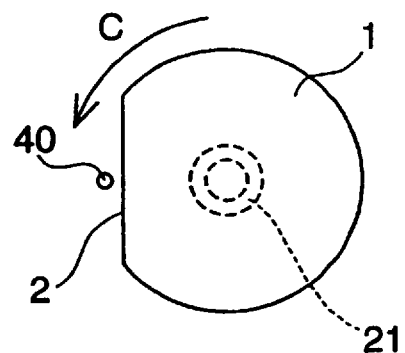

First, the θ correction motor 28 is rotated in the forward direction by the controller 132 so that the positional correction suction-holding stage 21 is rotated in the direction indicated by arrow B. In the state shown in FIG. 10(a), the θ correction fiber sensor 40 detects the wafer 1, however, when the point 3 on the orientation flat 2 of the wafer 1 cuts across the θ correction fiber sensor 40 as shown in FIG. 10(b), the direction fiber sensor 40 no longer detects the wafer 1. Using the number of pulses of the θ correction motor 28 at this time as a reference point (zero point), the counter 130 counts and saves therein the number of pulses of the θ correction motor 28 up to the point where the point 4 on the orientation flat 2 cuts across the θ correction fiber sensor so that the wafer 1 is again detected. The calculating part 131 then calculates and obtains half of the number of pulses saved in the counter 130, and the controller 132 renders the θ correction motor 28 to rotate in a reverse direction as shown by arrow C in FIG. 10(d) by a number of pulses equal to exactly half of the count. As a result, the orientation flat 2 is oriented perpendicular to a straight line connecting the center of the positional correction suction-holding stage 21 and the θ correction fiber sensor 40.

When the correction of the θ position of the wafer 1 by the wafer position correcting device 20 is thus completed, the vacuum suction of the positional correction suction-holding stage 21 is switched off, and the wafer 1 starts being conveyed in the direction of arrow A by the feeding pawl moving device 100. In this case, the wafer work suction-holding stage 46 of the wafer working device 45 remains in substantially the same position, and the upper surfaces of the stopper 39, the wafer work suction-holding stage 46 and the wafer carrying plates 72 and 73 are also positioned at the same height level.

First, the operating rod of the feeding pawl cylinder 112 retracts, and at the same time, the operating rod of the feeding pawl cylinder 126 is caused to protrude.

When the operating rod of the feeding pawl raising and lowering cylinder 112 retracts, the raising-and-lowering sliders 104 and 105 are lowered along the raising-and-lowering guide rails 102 and 103; and the raising-and-lowering plate 106, feeding pawl arm holding plate 111, first and second feeding pawl arms 114 and 115 and feeding pawls 116 and 117 are lowered together with the raising-and-lowering sliders 104 and 105. As a result, the feeding pawls 116 are positioned on the rear end (opposite from the front edge side) of the wafer on the positional correction suction-holding stage 21, and the feeding powls 117 are positioned on the rear end of a wafer (which has been previously moved) on the wafer work suction-holding stage 46.

Furthermore, when the operating rod of the feeding pawl cylinder 126 protrudes, the raising-and-lowering slider 120, the raising-and-lowering plate 121, the third feeding pawl arm 124 and the feeding pawl 125 are raised along the raising-and-lowering guide rail 103, so that the feeding pawl 125 is positioned on the rear end of a wafer 1 which is on the wafer carrying plates 72 and 73 of the wafer carrying table 70.

Next, the operating rod of the feeding pawl conveyor cylinder 113 (see FIG. 6) protrudes, so that the first and second feeding pawl arms 114 and 115 and therefore the feeding pawls 116 and 117 are moved horizontally in the wafer conveying direction (i. e., in the direction of arrow A) together with the feeding pawl arm holding plate 111. Furthermore, the third feeding pawl arm 124 and therefore the feeding pawl 125 are moved horizontally in the wafer conveying direction (i. e., the direction of arrow A) together with the feeding pawl arm holding plate 111.

As a result, (1) the wafer on the wafer carrying plates 72 and 73 of the wafer carrying table 70 is pushed by the feeding pawl 125 so that the wafer is moved into the unloader side magazine 16 of the unloader side elevator device 10B; (2) at the same time, the wafer on the wafer work suction-holding stage 46 of the wafer working device 45 is pushed by the feeding pawls 117 onto the wafer carrying plates 72 and 73 (in this case, when the wafer has passed over the stopper pins 60 and 61, the operating rods of the stopper pin driving cylinders 58 and 59 protrude so that the stopper pins 60 and 61 protrude from the upper surface of the wafer work suction-holding stage 46); and (3) the wafer on the positional correction suction-holding stage 21 of the wafer position correcting device 20 is pushed over the stopper 39 by the feeding pawls 116 and contacts the stopper pins 60 and 61 so that the wafer is positioned on the wafer work suction-holding stage 46.

When the wafer on the wafer carrying plates 72 and 73 is accommodated in the unloader side magazine 16 as described above, the elevator stage 11 of the unloader side elevator device 10B is raised by one pitch, so that the next accommodating space of the unloader side magazine 16 is positioned at the conveying level. In other words, wafers 1 are successively accommodated in the unloader side magazine 16 from the top of the magazine 16. When the wafer on the positional correction suction-holding stage 21 is pushed onto the wafer work suction-holding stage 46, the operating rod of the first stage mover cylinder 34 is retracted so that the positional correction suction-holding stage 21 is positioned below the upper portions of the belts 85. Then, the belt conveyor device 80 is operated so that the next wafer inside the loader side magazine 15 is conveyed onto the positional correction suction-holding stage 21 by the operation described above.

In the wafer working device 45, a heating means is internally mounted in the heating area suction-holding stage 46 in order to improve the reliability of bonding to the wafers, that is, in order to improve the bondability of the wafers. Accordingly, wafers on which working has been completed on the wafer work suction-holding stage 46 are heated. Such heated wafers are temporarily placed on the wafer carrying plates 72 and 73; and after being naturally cooled, the wafers are pushed into the unloader side magazine 16.

When a wafer is placed on the wafer work suction-holding stage 46, the vacuum suction of the wafer work suction-holding stage 46 operates so that the wafer is held in place by suction. Then, the operating rods of the stopper pin driving cylinders 58 and 59 are retracted so that the upper ends of the stopper pins 60 and 61 are lowered to beneath the wafer work suction-holding stage 46. In this state, bumps are formed in the respective bump formation areas of the wafer by the bonding apparatus 62.

One example of method for a bump formation is described in Japanese Patent Application Laid-Open (Kokai) Nos. 54-2662 and 4-41519.

The bump formation is performed on ¼ the surface area of each wafer at a time. In other words, when ¼ of the bonding on a single wafer has been completed, the operating rod of the second stage mover cylinder 57 protrudes so that the raising-and-lowering plate 48 is raised along the vertical rail 50, and the stage rotation motor 54 operates so that the wafer work suction-holding stage 46 is rotated 90 degrees by the drive pulley 55, belt 56 and driven pulley 53. Then, the operating rod of the second stage mover cylinder 57 is retracted so that the wafer work suction-holding stage 46 is lowered, thus causing the next ¼ of the surface area of the wafer positioned for a bonding work. When all of the bump attachment work for one wafer is thus completed by repeating the operation described above, the wafer is pushed in the wafer conveying direction (i. e., in the direction of arrow A).

An example of such a ¼ bonding method is described in Japanese Patent Application Publication (Kokoku) No. 62-31822 though the method therein is a wire bonding method and not a bump formation method.

As described above, the feeding pawls 116 of the first feeding pawl arm 114 push the rear end of a wafer 1 onto the positional correction suction-holding stage 21 so that the wafer is moved across the stopper 39 and placed on the wafer work suction-holding stage 46; and the feeding pawls 117 of the second feeding pawl arm 115 push the rear end of the wafer 1 on the wafer work suction-holding stage 46 so that the wafer 1 is moved onto the wafer carrying table 70; and further, the feeding pawl 125 of the third feeding pawl arm 124 pushes the rear end of the wafer 1 on the wafer carrying table 70 so that the wafer 1 is pushed into the unloader side magazine 16.

As seen from the above, the conveying of wafers to the wafer work suction-holding stage 46 and the discharge of wafers therefrom are accomplished by pushing the rear ends of the wafers; accordingly, wafers are conveyed with no external force being applied thereto, causing no deleterious effect on the wafers. Furthermore, the wafer work suction-holding stage 46 can be made larger than the size of the wafers, so that wafers held by suction on the wafer work suction-holding stage 46 can be worked by applying an external force to the wafers 1.

In the embodiment described above, the third feeding pawl arm 124 is disposed beneath the wafer carrying table 70; however, the third feeding pawl arm 124 can be disposed above the wafer carrying table 70. In this case, a means which moves the third feeding pawl arm 124 in a vertical direction can be eliminated by mounting the third feeding pawl arm 124 to the feeding pawl arm holding plate 111. In such a case, it would be necessary to use an unloader side magazine 16 which is open at the top so as to avoid interference with the feeding pawl 125.

The embodiment above is described with reference to a case in which bumps are formed on the wafers; however, it is obvious that the present invention can be used in cases where grooves are cut into the wafer surfaces in a checkerboard pattern by a rotary grindstone blade.

As seen from the above, according to the present invention, the feeding pawls of a first feeding pawl arm push the rear end of a wafer on the positional correction suction-holding stage so that the wafer is moved across the stopper and placed on the wafer work suction-holding stage; the feeding pawls of a second feeding pawl arm push the rear end of the wafer on the wafer work suction-holding stage so that the wafer is moved onto the wafer carrying table; and then the feeding pawl of a third feeding pawl arm pushes the rear end of the wafer on the wafer carrying table into the unloader side magazine. Thus, since the conveying of wafers onto the wafer work suction-holding stage and the discharge of wafers from the wafer work suction-holding stage are accomplished by pushing the rear ends of the wafers, wafers can be conveyed without receiving an external force, so that there is no deleterious effect on the wafers. Furthermore, since the wafer work suction-holding stage can be made larger than the size of the wafers, wafers held by suction on the wafer work suction-holding stage can be worked by applying an external force to the wafers. In addition, since the wafers are conveyed while suction is not applied to the top surfaces of the wafers, no scratching would occur on the wafer top surfaces.

We claim:

1. A wafer conveying apparatus in which wafers are supplied to a wafer work suction-holding stage from a loader side magazine, and worked wafers are moved into an unloader side magazine, said apparatus comprising:

a positional correction suction-holding stage for correcting positions of wafers, said positional correction suction-holding stage being disposed between said loader side magazine and said wafer work suction-holding stage and movable vertically and rotatably;

a wafer carrying table with a flat upper surface disposed between said wafer work suction-holding stage and said unloader side magazine, the wafer carrying table having a space at a center thereof with regard to a wafer conveying direction;

loader side and unloader side elevators which respectively raise and lower said loader side magazine and unloader side magazine;

a conveyor device conveying wafers from inside of said loader side magazine to a point above said positional correction suction-holding stage;

a pair of wafer position correcting pawls disposed so as to face each other in a direction perpendicular to said wafer conveying direction, said wafer position correcting pawls positioning said wafers by being moved back and forth while said wafers are raised slightly from said conveyor device by said positional correction suction-holding stage, a stopper means disposed between said positional correction suction-holding stage and said wafer work suction-holding stage so as to perform a positioning of said wafers; and a feeding pawl moving device for pushing a rear end of each of said wafers, said feeding pawl moving device being actuated:

after said positional correction suction-holding stage has been moved vertically so that an upper surface of said positional correction suction-holding stage is positioned at substantially the same level as an upper surface of said stopper means, or after said wafer work suction-holding stage has been moved vertically so that an upper surface of said wafer work suction-holding stage is positioned at substantially the same level as upper surfaces of said stopper means and wafer carrying table.

2. A wafer conveying apparatus according to claim 1, wherein said feeding pawl moving device comprises first, second and third feeding pawl arms which are driven in a vertical direction and in said wafer conveying direction, and feeding pawls of said first feeding pawl arm pushes a rear end of said wafer on said positional correction suction-holding stage so that said wafer is moved over said stopper means and onto said wafer work suction-holding stage, feeding pawls of said second feeding pawl arm pushes said rear end of said wafer on said wafer work suction-holding stage so that said wafer is moved onto said wafer carrying table, and a feeding pawl of said third feeding pawl arm is disposed in said space formed in said wafer carrying table and pushes said rear end of said wafer on said wafer carrying table so that said wafer is moved into said unloader side magazine.

3. A wafer conveying apparatus, which is provided between a loader side elevator means and an unloader side elevator means which respectively raise and lower a loader side magazine and an unloader side magazine so that a wafer is conveyed from said loader side magazine to said unloader side magazine, said apparatus comprising:

a positional correction suction-holding stage disposed next to said loader side elevator means and movable vertically and rotatable so as to accomplish a positioning of said wafer;

a conveyor device for conveying said wafer from said loader side magazine to a point above said positional correction suction-holding stage;

a wafer work suction-holding stage upon which working on said wafer is accomplished, said wafer work suction-holding stage being disposed next to said positional correction suction-holding stage;

a wafer carrying table provided between said wafer work suction-holding stage and said unloader side elevator means, said wafer carrying table having a space at a center thereof with regard to a wafer conveying direction; and a feeding pawl moving device for moving said wafer, said feeding pawl moving device comprising a first feeding arm, a second feeding arm and a third feeding arm which are driven in a vertical direction and in said wafer conveying direction, said first feeding arm being provided with feeding pawls which push said wafer from said positional correction suction-holding stage onto said wafer work suction-holding stage, said second feeding arm being provided with feeding pawls which push said wafer from said wafer work suction-holding stage onto said wafer carrying table, and said third feeding arm being provided with a feeding pawl so as to be movable within said space of said wafer carrying table, thus pushing said wafer from said wafer carrying table into said unloader side magazine.

* * * * *